United States Patent [19]

Sugiyama et al.

[11] 3,986,837
[45] Oct. 19, 1976

[54] METHOD OF AND APPARATUS FOR MANUFACTURING SINGLE CRYSTAL COMPOUND SEMICONDUCTOR

[75] Inventors: Seiji Sugiyama, Fuji; Hiroshi Yamashima, Shizuoka, both of Japan

[73] Assignee: Nikkei Kako Kabushiki Kaisha, Tokyo, Japan

[22] Filed: Mar. 7, 1974

[21] Appl. No.: 449,040

[30] Foreign Application Priority Data
Mar. 8, 1973   Japan................................. 48-26622

[52] U.S. Cl.......................... 23/273 SP; 156/616 R; 156/617 H; 156/619
[51] Int. Cl.²......................................... B01J 17/20
[58] Field of Search.................. 23/273 SP, 301 SP; 156/616, 619, 617

[56] References Cited
UNITED STATES PATENTS

| | | |
|---|---|---|
| 2,719,799 | 10/1955 | Christian ........................ 23/301 SP |
| 2,826,666 | 3/1958 | Cater ............................. 23/273 SP |
| 2,962,363 | 11/1960 | Martin ........................... 23/273 SP |
| 3,020,132 | 2/1962 | Gunther-Mohr ................ 23/273 SP |
| 3,036,898 | 5/1962 | Brock ............................. 23/273 SP |
| 3,189,415 | 6/1965 | Emeis ............................ 23/301 SP |
| 3,211,881 | 10/1965 | Jablonski ....................... 23/301 SP |
| 3,233,984 | 2/1966 | Erdman .......................... 23/273 SP |
| 3,351,433 | 11/1967 | Keller ............................. 23/301 SP |
| 3,401,022 | 9/1968 | Marshall ......................... 23/273 SP |
| 3,560,276 | 2/1971 | Panish ............................ 23/273 SP |

Primary Examiner—Stephen J. Emery
Attorney, Agent, or Firm—A. W. Breiner

[57] ABSTRACT

Method of and apparatus for manufacturing a single crystal compound semiconductor in a boat, whereby the melt forming the crystal is maintained at a higher temperature at its surface in contact with the bottom of the boat, than at its free surface in order that solidification of the melt begins at its free surface. Uniform crystallinity without structural defects or impurities is obtained.

3 Claims, 4 Drawing Figures

METHOD OF AND APPARATUS FOR MANUFACTURING SINGLE CRYSTAL COMPOUND SEMICONDUCTOR

This invention relates to method and apparatus for manufacturing single crystal compound semiconductors.

Single crystal compound semiconductors find extensive applications in various fields of the electronics industry and are used for the manufacture of transistors, rectifiers, light emitting diodes and so forth. These semiconductor products depend for their various properties upon the cystallinity of a single crystal used as the starting material, so that the structural defects such as dislocations and slips in the single crystal must be minimal. With the prior-art horizontal single crystal manufacturing furnace and method of manufacturing single crystal using this furnace, however, it has been very difficult to meet the above requirement.

In the prior art process of manufacture of single crystals using the horizontal furnace, it is considered necessary to maintain the melt in the boat at a uniform and constant temperature, and to this end use is made of a structure using a core tube or sleeve extending through the furnace in the axial direction thereof. With such apparatus and process employed for solidifying the melt in the boat, the melt is first solidified at its free surface and its surfaces in contact with the inner walls and bottom of the boat, these surface portions being capable of ready cooling with changes in temperature in the furnace, and the solidification proceeds with time inwardly and ends at the center portion of the melt which part is most difficult to cool. With this method, however, a slight amount of impurity(s) contained in the melt and also undesired reaction products resulting from the reactions the melt the material of the boat wall in contact with the melt migrate toward and accumulate in the central portion of the melt. Therefore, dislocations are increased, and, in some cases, growth of polycrystals or mosaic structures occur. Also, the fact that the central portion of the melt is finally solidified means that structural supercooling is likely to result within the crystal in the course of the solidification, which means that polycrystalline phase is likely to be introduced into the already solidified crystal. Further, the formation of a polycrystal or the like in the center of the crystal leads to difficulties encountered in after treatment for removing the structurally defective portions. From the above grounds, with the prior-art method of manufacture of single crystal compound semiconductors using horizontal single crystal manufacturing furnace it has been difficult to achieve high yield of manufacture of a superior single crystal compound semiconductor with few structural defects. Also, in the aspect of the apparatus the core tube or sleeve used for the purpose of uniform heating is considerably expensive from the standpoint of material and processing required, and its wear is considerably significant. This means such disadvantages as complicated construction of equipment and high installation cost and running expenditure.

The present invention is based upon extensive investigations and experiments conducted for the purpose of overcoming the afore-mentioned drawbacks and disadvantages in the prior art method and apparatus.

More particularly, the primary object of the invention is to provide a method for manufacturing single crystal compound semiconductors with few structural defects with high yeild.

A second object of the invention is to provide a horizontal furnace for manufacturing single crystals, which is simple in construction, inexpensive and permits the achievement of the first-mentioned object adequately.

The method of manufacturing single crystal compound semiconductors according to the invention, unlike the prior-art method where the melt in the boat is solidified through cooling by maintaining the whole melt at uniform temperature, is featured in that a requisite temperature difference is positively provided in the vertical direction of the furnace such that the solidification proceeds from the free surface of the melt, proceeds with time past the center of the melt and ends at the surface of the melt in contact with the bottom of the boat. In other words, in the method of solidifying the melt in accordance with the invention the temperature of the melt at its surface in contact with the bottom of the boat is held higher than its temperature at its free surface such that the solidification of the melt proceeds in such a way that liquid phase side normals to isomers along the interface between solid and liquid phases are always directed to the bottom of the boat. To the end of maintaining the temperature of the melt at its surface in contact with the bottom of the boat higher than its temperature at its free surface in the afore-mentioned method, the apparatus according to the invention features that the core tube which has been thought indispensable for the prior-art horizontal furnace for manufacturing single crystal compound semiconductor of this type is abolished and that a desired number of radiation means effective in a direction normal to the axial direction of the furnace are provided to produce a requisite temperature difference in the vertical direction of the furnace.

The invention will now be described in connection with the accompanying drawings.

In the drawing FIG. 1 is a longitudinal sectional view outlining the apparatus according to the invention.

Figure 1:
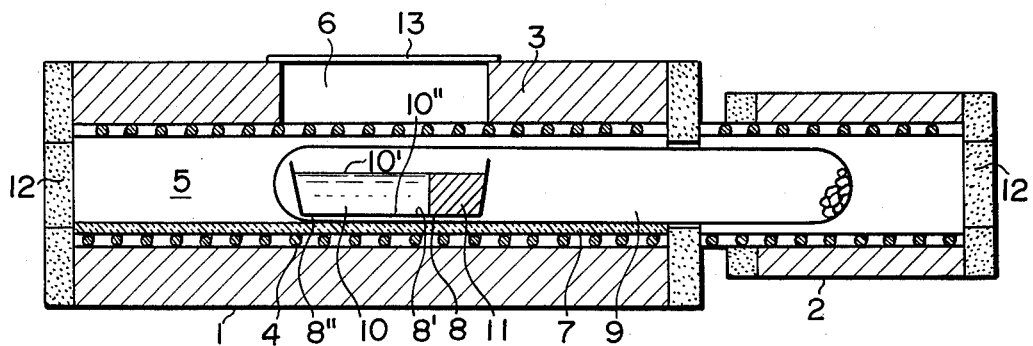
Figure 3:
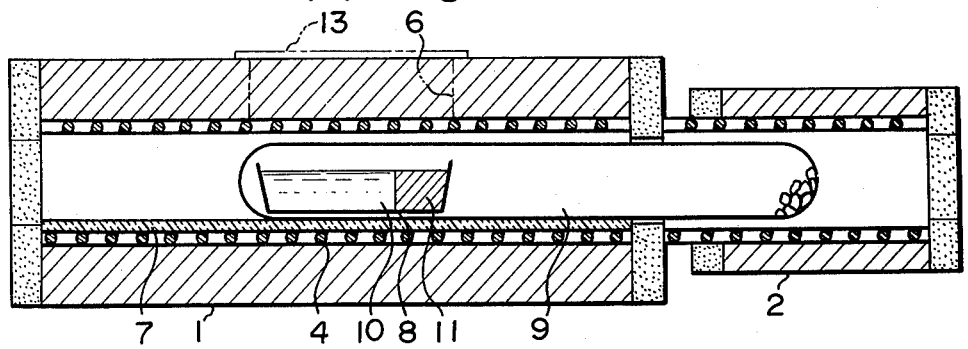
FIG. 3 is a longitudinal sectional view showing another embodiment of the apparatus according to the invention.
Figure 2:
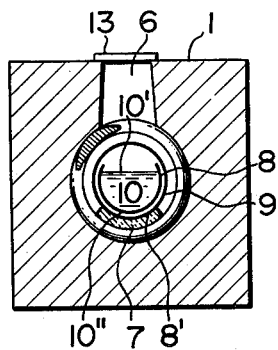
FIG. 2 is a transversal sectional view of the same.
Figure 4:
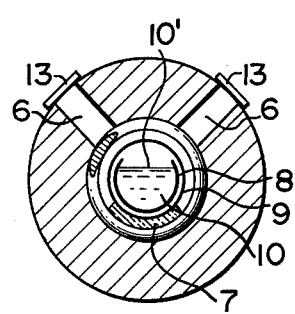
FIG. 4 is a transversal sectional view of the same.

Throughout the drawing, numeral 1 designates the furnace body, 2 the sub-surface thereof, 4 a heater, 6 a radiation window, 7 a heat insulating plate, 8 a quartz boat or like vessel, 8' the boat bottom, 8'' the boat bottom at one end, 9 a quartz ampule, 10 the melt, 10' the free surface, 10'' the surface of melt in contact with the bottom of boat, and 11 the seed crystal. The horizontal furnace for manufacturing a single crystal compound semiconductor comprises, like that of the prior-art construction, according to the invention a horizontal furnace body 1 such as horizontal Bridgeman type or Gradient Freesing type constructed with heat insulating material 3 and a sub-furnace 2 interconnected to the furnace body 1, with a spirally coiled heater 4 disposed around the inner periphery of the furnace body 1 and subfurnace 2. According to the invention, unlike the prior-art furnace no core tube extending through the furnace in the axial direction thereof is provided, but the interior in situ surrounded by a heater 4 constitutes a treatment chamber 5. The furnace wall defining the treatment chamber 5 is provided with a radiation window 6 open in the direction normal to the axis of the furnace body 1 and communicating with the treatment chamber 5. Also, a heat insulating plate 7 of a material consisting of alumina, silicone carbide of the like is positioned in a lower portion of the treatment chamber 5 diametrically opposite to the radiation window 6. A quartz ampule 9 accommodating a boat 8 containing the melt 10 to be treated and a seed crystal 11 is adapted to be placed on the heat insulating plate 7 for the treatment. In the embodiment of FIGS. 1 and 2, only a single radiation window 6 extending in the longitudinal direction of the furnace body 1 over a central portion thereof is provided. Alternatively, a plurality of such windows may be provided as shown in FIGS. 3 and 4. The length of the radiation window 6 is slightly greater than the length of the boat 8, and its width is substantially equal to or slightly greater than the width of the boat 8. Reference numeral 12 desigates a port, through which the quartz ampule 9 is charged and taken out, and numeral 13 a quartz plate place over radiation window 6.

The method of the invention using the furnace as in the above embodiment will now be described. The quartz ampule 9, which is sealed and accommodates the boat 8 filled with the starting material and disposed near its one end and such material as arsenic near its other end as seed is loaded into the treatment chamber 5 through the port 12 and placed on the heat insulation plate 7 by a pusher or other suitable means. The quartz ampule 9 is loaded such that the free surface 10' of the melt 10 faces the radiation window 6, with the arsenic or like material positioned within the sub-furnace 2, as is illustrated. In this state, the melt 10 contained in the boat 8 is cooled by reducing the current supplied to the heater 4 or by moving the furnace body 1. In this way, an adequate temperature difference can be produced between part of the heater 4 located in the neighborhood of the center of the radiation window 6 and the heat insulating plate 7 diametrically opposite to that location. Thus, the cooling will proceed with the free surface 10' of the melt 10 facing the radiation window 6 always held at a lower temperature than the temperature of the surface 10'' of the melt in contact with the bottom of the boat 8. This means that the solidification always starts with the free surface 10' of the melt and proceeds with time downwardly past the central portion of the melt, the surface of the melt in contact with the bottom 8' of the boat being solidified at the end.

The afore-mentioned function of heat radiation can be ensured since the furnace body 1 is not provided with any core tube but is directly provided with the radiation window or windows 6. The temperature difference in the vertical direction of the furnace can be varied up to about 30° C by varying the area of the opening of the radiation window 6 or the thickness of material of the insulating plate 7, and the size of the radiation window can be suitably varied by covering the same with a heat insulating material of a cap-like shape. The maximum temperature difference in the vertical direction of the furnace is set to about 30° C, because if this value is exceadad not a single crystal but a polycrystal is liable to result due to excessive cooling. The lower limit of the temperature difference is about 8° C although this value is not to be construed as a limitation.

As has been mentioned earlier, according to the invention the solidification through cooling starts with the free surface 10' of the melt and proceeds with time past the central portion of the melt, with the surface of the melt in contact with the bottom 8' of the boat being solidified at the end. Thus, very minute and slight impurities contained in the melt inclusive of the free surface 10' being solidified migrate toward the higher temperature zone. With further progress of the solidification the minute impurities migrating toward the bottom of the boat 8 held at a higher temperature than the free surface 10' is ultimately accumulated in a zone of the melt in contact with the bottom of the boat 8. With the progress of the solidification, however, the accumulated impurities execute diffusive movement along the bottom 8' of the boat together with undesired reaction products resulting from reactions between the material of the bottom 8' of the boat and the melt toward the bottom 8'' at the other end of the boat, and in the final stage of solidification, and this foreign matter precipitates in the melt in contact with the bottom 8'' at the other end of the boat. Thus, according to the invention it is possible to obtain a high quality single crystal compound semiconductor since undesired impurities and reaction products will be excluded from the melt being solidified. Also, since the solidification ends not at the center of the melt but at the end thereof, the treatment for the removal of the impurities and reaction products can be readily carried out. In consequence, it is thus possible to obtain a high quality product with high yield.

Furthermore, with the apparatus according to the invention the above desirable effects can be obtained with a simple apparatus constructed by merely providing the horizontal furnace with the radiation window for setting up the required temperature difference in the vertical direction of the furnace. Besides, since the core tube which constitutes an expensive consumable can be dispensed with, not only the whole construction of the furnace can be simplified but also equipment and operation costs can be reduced, which leads to a reduced cost of manufacture of the single crystal compound semiconductor.

The following examples are given to specifically illustrate the afore-mentioned aspects of the invention.

EXAMPLE 1

GaAs single crystal compound semiconductor was manufactured by using a furnace constructed with a horizontal furanace body provided with a built-in spiral heater and a sub-furnace for the As vapour pressure control. The furnace body did not have any core tube and is provided with a radiation window with a width of 15mm and a length of 250mm extending in the longitudinal direction of the furnace body over a central portion thereof, with a heat insulating plate of a material consisting of alumina disposed in the lower portion of its interior. As the sample 450 grams of polycrystalline GaAs was used filling a quartz boat, which had a length of 200mm and an inner diameter of 35mm, and in which a seed with crystal orientation was placed at its one end. This quartz boat was placed in a quartz ampule at a predetermined position thereof and was sealed therein. This quartz ampule was placed on the heat insulating plate at a predetermined position thereof, as shown in FIG. 1. The temperature in the furnace was then elevated such that the temperature difference between part of the heater extending beneath the center of the radiation window and the heat insulating plate at the diametrically opposite location was 20° C for contacting the melt with the seed. Then, the whole melt was solidified at a cooling rate of 1.5° C per by maintaining the afore-mentioned temperature difference.

Examination of the crystal thus obtained, according to the stain-etching method after splitting the crystal in the longitudinal direction, revealed that normals to isotherms formed on the liquid phase side along the interface between solid and liquid phases during the process of solidification are directed toward the bottom of the quartz boat, so that it was confirmed that the solidification of the melt began with the free surface of the melt and proceeded past the center of the melt to end at the bottom of the quartz boat. The dislocation densities at the front and rear ends of the GaAs single crystal obtained were 4,500 and 6,000 per square centimeter respectively. The yield was 75 percent, which is a marked increase over 30 percent obtainable according to the prior-art method.

EXAMPLE 2

GaAs single crystal was manufactured in a way similar to Example 1 except that the furnace body was provided with two radiation windows 15mm wide and 250mm long, with their cross sectional center lines passing through the cross sectional center of the furnace and making an angle of 45° as shown in FIG. 3, and that the temperature difference between part of the heater extending beneath the center of the radiation window and the heat insulating plate at the diametrically opposite location was set to 15° C.

By examining the GaAs single crystal thus obtained in the manner as described in the Example 1 similar results to the Example 1 were confirmed. The dislocation densities at the front and rear ends of the single crystal obtained were 4,800 and 7,000 per square centimeter respectively. The yield was 70 percent, which was again a marked increase over 30 percent in case of the prior-art method.

As has been described in the foregoing, according to the first featured aspect of the invention a high quality single crystal compound semiconductor containing few structural defects can be obtained with high yield by a simple method. Also, according to the second featured aspect of the invention it is possible to realize the afore-mentioned feature with a simple apparatus calling for low equipment and maintenance costs. Thus, the invention is greatly useful in industry.

We claim:

1. An apparatus for manufacturing a single crystal comprising a melt boat having an upper free surface and a bottom surface for receiving a seed at one end thereof and a crystal forming material at the other end thereof, a furnace for receiving said melt boat comprising an elongated horizontal body having a heating coil disposed around the inner periphery thereof, at least one radiation window in the upper part of said furnace to provide a communication area between the inside of said furnace and the outside thereof, said window and melt boat being mated in construction and proportioned whereby said window communication area is at least equal to the dimensions of the melt boat and communicates with said upper surface of said melt boat, and insulation means provided throughout the inside and bottom of said furnace, said window communication area, insulation means, and furnace being constructed and arranged and proportioned to provide and maintain a temperature gradient between the upper and bottom surfaces of the melt boat whereby solidification of the melted crystal forming material starts at the upper free surface of said boat and at the seed side, proceeds past the center of the melt in said boat and terminates at the surface of the melt in contact with the bottom of the boat, thereby providing a uniform single crystal.

2. The apparatus of claim 1 including a plurality of radiation windows.

3. The apparatus of claim 1 wherein said window communication area, insulation means, and furnace are selected to provide a temperature gradient of from 8° C. between the upper and bottom surfaces of said melt boat and 30° C. between the upper and bottom surfaces of said melt boat.

\* \* \* \* \*